United States Patent
Holder

[19]

[11] Patent Number: 5,913,975
[45] Date of Patent: Jun. 22, 1999

[54] CRUCIBLE AND METHOD OF PREPARATION THEREOF

[75] Inventor: John Davis Holder, St. Louis, Mo.

[73] Assignee: MEMC Electronic Materials, Inc., St. Peters, Mo.

[21] Appl. No.: 09/017,942

[22] Filed: Feb. 3, 1998

[51] Int. Cl.[6] .................................................. C30B 13/00
[52] U.S. Cl. ........................... 117/900; 117/932; 117/31; 117/213; 117/943
[58] Field of Search .................................. 117/900, 932, 117/31, 213, 943

[56] References Cited

U.S. PATENT DOCUMENTS

| | | | |
|---|---|---|---|
| 4,572,729 | 2/1986 | Lang et al. | 65/18.1 |
| 4,935,046 | 6/1990 | Uchikawa et al. | 65/18.2 |
| 4,956,208 | 9/1990 | Uchikawa et al. | 428/34.6 |
| 5,284,631 | 2/1994 | Kaneto et al. | 117/900 |
| 5,306,388 | 4/1994 | Nakajima et al. | 117/900 |
| 5,308,446 | 5/1994 | Bihuniak et al. | 117/900 |
| 5,720,809 | 2/1998 | Iino et al. | 117/900 |

*Primary Examiner*—Benjamin Utech
*Assistant Examiner*—Kin-Chan Chen
*Attorney, Agent, or Firm*—Senniger, Powers, Leavitt & Roedel

[57] ABSTRACT

A quartz crucible for use in the preparation of silicon crystals substantially free from crystal void defects and a process for its preparation are disclosed. The crucible is prepared by introducing quartz powder into a rotating mould in an atmosphere containing less than about 0.5% insoluble gases such as argon. The quartz powder accumulates along the inner surface of the mould, and is subsequently heated to fuse the quartz powder to produce the crucible. The gases contained in the bubbles in the resulting crucible are comprised of less than about 0.5% insoluble gases.

7 Claims, 1 Drawing Sheet

CRUCIBLE AND METHOD OF PREPARATION THEREOF

BACKGROUND OF THE INVENTION

The present invention relates to a process for the preparation of a quartz crucible for use in the preparation of single crystal silicon materials substantially free from crystal void defects. More particularly, the present invention relates to the production of quartz crucibles which contain a very low amount of gases which are insoluble in liquid silicon.

In the production of single silicon crystals grown by the Czochralski method, polycrystalline silicon is first melted down within a quartz crucible. After the polycrystalline silicon has melted and the temperature equilibrated, a seed crystal is dipped into the melt and subsequently extracted while the crucible is rotated to form a single crystal silicon ingot.

High quality quartz glass is an indispensable material in semiconductor technology in producing and processing crucibles because of its purity, temperature stability and chemical resistance. However, because of the direct contact between the very high temperature, aggressive silicon melt and the wall of the quartz crucible, the danger of contamination of the melt with impurities from the crucible is great.

Translucent quartz crucibles are generally produced by a process in which quartz powder is introduced into a mould to be accumulated to form a layer along the inner surface of the mould. The layer of the quartz powder is then heated and fused at the inner surface thereof while the mould is being rotated to produce a quartz crucible having a relatively high bubble content. As used herein, the term "bubbles" refers to bubbles of air or pockets of air contained in the crucible voids. Generally, translucent quartz crucibles contain bubbles ranging from about 50–200 microns in diameter, with the average bubble having a diameter of about 100 microns. There are approximately 70,000 bubbles/cm$^3$ in translucent crucibles. These quartz crucibles are advantageous in that they have high strength and are relatively easy to form in large sizes. For these reasons, translucent crucibles are widely utilized.

However, translucent crucibles which contain bubbles throughout the entire structure are not without drawbacks. As the silicon melt stays in contact with the crucible during the crystal pulling, which can be up to 100 hours or more for larger diameter ingots or melts of large mass, the melt continuously reacts with and dissolves the crucible. This dissolution of the quartz crucible causes bubbles in the quartz wall to become exposed and burst. This bursting not only releases the gases inside the bubble into the melt, but also can result in the release of quartz particulates into the melt. These particulates in the melt can come into contact with the growing crystal at the melt interface and be incorporated into the crystal structure. When this happens, a resulting structure loss in the crystal can occur which may lead to a decreased throughput.

In order to improve throughput and reduce resulting crystal contamination, crucibles having a reduced size and density of bubbles or, "bubble free zones", on the inside wall portion of the crucible have been utilized. Uchikawa et al. in U.S. Pat. No. 4,956,208 teach producing a quartz glass crucible having a translucent outer layer with a high bubble content and an inner transparent glass layer which is substantially free from bubbles. The transparent, or substantially bubble free, layer is about 0.3 to 3 millimeters thick, and contains a small number of bubbles which have a diameter less than 50 microns. However, such "bubble free zone" crucibles have had limited success in eliminating all crucible related crystal defects. Due to the long duration of crystal pulling required to produce large diameter crystals, i.e. a 100 hours or more, the substantially bubble free zone of Uchikawa et al. may be dissolved before the crystal is complete and the translucent portion of the crucible may then release bubbles into the melt. Alternatively, even if the transparent layer is sufficiently thick, this layer still contains bubbles which are released into the melt and may directly contact the growing crystal. A true "bubble free zone" containing no bubbles has not yet been commercially produced.

Furthermore, it has now been discovered that the bubbles, which are comprised of air in conventionally prepared crucibles, that are released into the melt contain gases which are thermodynamically stable and highly insoluble in liquid silicon. Such unreactive gases, especially argon, can become trapped at the growth interface and cause crystal void defects, or pockets of gas on the crystal surface, which are detected as Large Light Point Defects (LLPDs). Such defects effect up to 4% of wafers sliced from grown crystals and cause these slices to be unfit for grade 1 wafer product.

Therefore, a need still exists in the semiconductor industry for a crucible which will not release a large number of bubbles containing insoluble gases into the polycrystalline melt that subsequently may lead to the formation of gas voids in the resulting crystal.

SUMMARY OF THE INVENTION

Among the objects of the present invention, therefore, are the provision of a quartz crucible capable of minimizing resulting crystal void defects in single silicon crystals; the provision of a quartz crucible that contains bubbles containing extremely low amounts of insoluble gases; the provision of a quartz crucible which increases throughput of grade 1 silicon wafers; the provision of a quartz crucible which minimizes the presence of bubbles containing insoluble gases at the melt-crystal interface; the provision of a quartz crucible having a substantially bubble free zone on the inner layer wherein the bubbles in the bubble free zone contain extremely low amounts of insoluble gases; and the provision of a process for producing a quartz crucible where the crucible is fused in an atmosphere substantially free from insoluble gases.

Briefly, therefore, the present invention is directed to a process for making a quartz crucible used in the preparation of single silicon crystals substantially free from crystal void defects. In an atmosphere containing less than about 0.5% insoluble gases, quartz powder is introduced into a mould to form a layer along the inner surface, and the mould is subsequently heated to fuse the quartz and produce the crucible.

The invention is further directed to a quartz crucible for use in preparing silicon crystals substantially free from crystal void defects wherein the gases in the bubbles in the crucible are comprised of less than 0.5% insoluble gases.

The invention is further directed to a quartz crucible for use in preparing silicon crystals substantially free from crystal void defects, wherein the crucible has a bubble free zone on the inner surface, and the gases in the bubbles located in the bubble free zone, as well as the remaining portion, are comprised of less than 0.5% insoluble gases.

Other objects and features of this invention will be in part apparent and in part pointed out hereinafter.

DETAILED DESCRIPTION OF THE PREFERRED EMBODIMENTS

Figure 1:
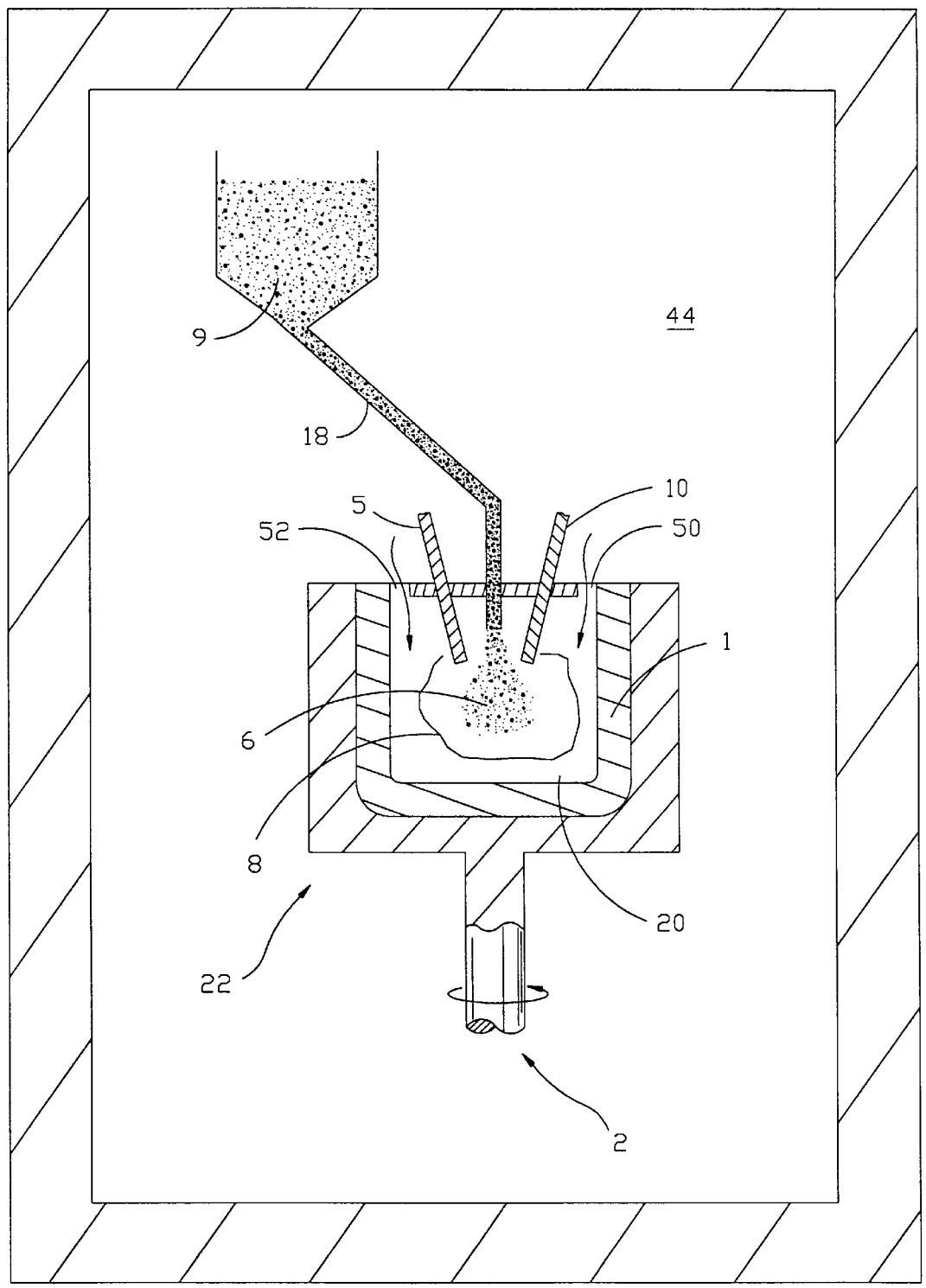
FIG. 1 is a sectional view of an apparatus for producing a crucible in accordance with the present invention.

In accordance with the present invention, it has been discovered that crystal void defects, detected as Large Light Point Defects (LLPDs), in silicon wafers sliced from single silicon crystals can be significantly reduced or eliminated by fusing the crucible that the crystal is pulled from in an atmosphere substantially free from gases insoluble in liquid silicon, especially argon. The crucible of the present invention can be prepared with or without a bubble free zone on the inner surface. Significantly, it has been discovered that argon is thermodynamically stable and virtually totally inert in the silicon melt and when trapped at the melt-liquid interface, becomes a crystal void defect in the grown crystal. By fusing crucibles in an atmosphere with a reduced amount of insoluble gases such as argon, the bubbles which form in the crucible voids have a reduced content of insoluble gases such as argon. Thus, when the bubbles are released into the melt as the crucible dissolves during crystal growth, insoluble gas-causing crystal void defects in the crystal are minimized or eliminated.

Referring to FIG. 1 there is shown an apparatus 22 for producing quartz crucibles. Apparatus 22 is totally surrounded by atmosphere 44, and may be contained in a sealed room with appropriate venting or an open area. A rotatable mould 1 is provided with a rotating shaft 2. In the mould 1, there is a cavity 20 for forming the crucible. The mould 1 is rotated and heat sources 5 and 10 are inserted into the cavity 20. Heat sources 5 and 10 produce a high temperature atmosphere 8 in the mould 1. A quartz powder 6 is supplied to the high temperature gas atmosphere 8 through line 18. The quartz powder 6 is deposited on the inner surface of the mould 1, and fused to form a crucible with heat from heat sources 5 and 10.

The quartz powder 6 is fed from a supply tank 9. The mould 1 may be provided with a cooling mechanism of a conventional type. The configuration and the size of the mould 1 may be appropriately determined depending on the configuration and the size of the crucible to be produced. The mould 1 is made of a material having a satisfactory heat resistance and mechanical strength.

The gas atmosphere 8 inside the mould 1 is comprised of the same gas as atmosphere 44 surrounding the entire apparatus 22. Gas from atmosphere 44 surrounding the apparatus 22 can enter the mould 1 to form high temperature gas atmosphere 8 through openings 50 and 52 contained above the mould 1. Alternatively, gas from atmosphere 44 could be injected into the mould 1 through line 18. As previously stated, atmosphere 44 surrounding the apparatus 22 is comprised of the same gas as gas atmosphere 8, and contains less than about 0.5%, more preferably less than about 0.1%, and most preferably less than about 0.01% of gases insoluble in silicon. As used herein, the term "insoluble in silicon" or "insoluble gases" means that the gas is virtually non-reactive with liquid silicon and is capable of surviving in liquid silicon without dissolution. Examples of gases which are insoluble in silicon are argon, xenon, helium, neon, and krypton. For example, conventional techniques used to measure the dissolution of gases in liquid silicon have to date been unable to measure any dissolution of argon in liquid silicon. Such gases, especially argon, are thermodynamically stable, and virtually totally inert in the silicon melt, which is at a temperature of about 1420° C. These thermodynamically stable gases in silicon remain in the melt as small bubbles, and can remain in the melt for extended periods of time. Eventually, the bubbles can surface near the melt interface and become trapped and form void defects in the crystal.

Of the above-listed gases, argon has the highest natural abundance, and comprises about 1% of air. As such, it is critical to control the amount of argon present in the atmosphere surrounding the apparatus producing the crucible. It is most preferred that the gas atmosphere 44 contain less than about 0.01% argon.

Suitable gas atmospheres, for example, may be comprised of synthetic air (i.e. air with a reduced argon content), a mixture of nitrogen and oxygen, or pure nitrogen. Because many crucible manufacturing stations are located within sealed areas which are vented directly into the surrounding area as opposed to the outside atmosphere, synthetic air is the most preferred gas atmosphere as it does not pose an asphyxiation risk to workers upon discharge from the sealed crucible manufacturing area. Synthetic air suitable for use in the present invention should contain less than 0.5% argon, more preferably less than 0.1% argon, and most preferably less than 0.01% argon. Suitable synthetic air is commercially available from OXARC, Inc. (Spokane, Wash.). If a mixture of oxygen and nitrogen or pure nitrogen is used as the gas atmosphere, it is preferred that the gases be at least 99.5% pure with respect to insoluble gases, more preferably at least 99.9% pure with respect to insoluble gases, and most preferable at least 99.99% pure with respect to insoluble gases.

The resulting crucible prepared in accordance with the present invention contains about 70,000 bubbles/cm$^3$. The diameter of the bubbles range from about 50–200 microns, with the average diameter being about 100 microns. In an alternative embodiment, the crucible may be prepared having a "bubble free zone", or transparent inner layer as taught by Uchikawa et al. in U.S. Pat. No. 4,956,208, which is hereby incorporated by reference. It is noted, however, that the bubble free zone of Uchikawa et al. still contains bubbles. These bubbles generally have a diameter between 20 and 50 microns, and are present up to about 10 bubbles/cm$^3$. If a crucible prepared in accordance with the present invention utilizing an atmosphere containing a reduced amount of insoluble gases is prepared to have a bubble free zone on the inner surface as taught by Uchikawa et al. for example, it is preferable that the bubble free zone be at least 1.5 millimeters thick and the bubbles within the bubble free zone contain less than 0.5% insoluble gases, more preferably at least 2 millimeters thick and the bubbles within the bubble free zone contain less than 0.5% insoluble gases, and still more preferably about 3 millimeters thick and the bubbles within the bubble free zone contain less than 0.5% insoluble gases. It will be recognized by one skilled in the art that the bubbles in the translucent portion of a crucible prepared according to the present invention in combination with a bubble free zone will contain the same amount of insoluble gases as the bubbles in the bubble free zone. Significantly, crucibles prepared utilizing the atmosphere containing a reduced amount of insoluble gases of the present invention in combination with a bubble free zone as set forth in Uchikawa et al., for example, have the additional advantage of reducing the amount of quartz released into the melt upon the bursting of the bubbles as the amount of bubbles in the bubble free zone is significantly reduced.

The bubbles contained in the crucible, regardless of their location, are gas from the gas atmosphere 44 within which the crucible was produced. A portion of these bubbles are subsequently released from the inside crucible wall into the silicon melt throughout the crystal pulling process as the melt is in contact with the crucible and reacts with and dissolves part of the crucible wall. With crucibles prepared by the conventional method utilizing air as the gas atmosphere, the bubbles contain a high level of gases which are insoluble in silicon, especially argon. As the bubbles are released from the crucible wall, the insoluble gases contained in the bubbles can remain in the melt for extended periods of time and eventually become trapped at the melt interface and cause crystal void defects in the resulting crystal as discussed above.

However, when the crucibles of the present invention, which have been produced in a gas atmosphere having a significantly reduced amount of insoluble gases such as argon, release bubbles into the melt, the resulting crystal is substantially free from crystal void defects. As used herein, the term "substantially free from crystal void defects" means that the resulting crystal contains at least 50%, more preferably at least 90%, and most preferably 100%, fewer crystal void defects than a crystal produced under similar operating conditions using conventional crucibles that were fused in an atmosphere of air. The resulting crystal is substantially free from crystal void defects as the amount of insoluble gases such as argon released into the melt is significantly reduced or eliminated through use of the crucible of the present invention. Therefore, a much larger percentage of wafers sliced from the single crystal will be suitable grade 1 material.

In view of the above, it will be seen that the several objects of the invention are achieved.

As various changes could be made in the above-described process for producing a crucible without departing from the scope of the invention, it is intended that all matter contained in the above description be interpreted as illustrative and not in a limiting sense.

What is claimed is:

1. A quartz crucible for use in the preparation of single silicon crystals substantially free from crystal void defects, the crucible containing bubbles comprised of gases, the gases in the bubbles being comprised of less than about 0.5% insoluble gases.

2. A crucible as set forth in claim 1 wherein the gases in the bubbles are comprised of less than about 0.1% insoluble gases.

3. A crucible as set forth in claim 1 wherein the gases in the bubbles are comprised of less than about 0.01% insoluble gases.

4. A quartz crucible for use in the preparation of single silicon crystals substantially free from crystal void defects, the crucible having an inner layer at least about 1.5 millimeters thick and being substantially free from bubbles, the bubbles containing gases, and the gases in the bubbles being comprised of less than about 0.5% insoluble gases.

5. A quartz crucible as set forth in claim 4 wherein the inner layer is at least about 2 millimeters thick.

6. A quartz crucible as set forth in claim 4 wherein the inner layer is about 3 millimeters thick.

7. A quartz crucible for use in the preparation of single silicon crystals substantially free from crystal void defects, the crucible having an inner layer about 3 millimeters thick and being substantially free from bubbles, the bubbles containing gases, and the gases in the bubbles being comprised of less than about 0.01% argon.

* * * * *